United States Patent
Liu et al.

(10) Patent No.: US 10,105,722 B2
(45) Date of Patent: Oct. 23, 2018

(54) PHOTORESIST COATING APPARATUS AND METHODS

(71) Applicant: Semiconductor Manufacturing International (Shanghai) Corporation, Shanghai (CN)

(72) Inventors: Yang Liu, Shanghai (CN); Qiang Wu, Shanghai (CN); Huayong Hu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 1040 days.

(21) Appl. No.: 14/287,716

(22) Filed: May 27, 2014

(65) Prior Publication Data
US 2014/0363565 A1 Dec. 11, 2014

(30) Foreign Application Priority Data
Jun. 5, 2013 (CN) .......................... 2013 1 0222164

(51) Int. Cl.
H01L 21/027 (2006.01)
B05B 12/12 (2006.01)
G03F 7/16 (2006.01)

(52) U.S. Cl.
CPC ................ B05B 12/12 (2013.01); G03F 7/16 (2013.01)

(58) Field of Classification Search
CPC .................................. B05B 12/12; G03F 7/16
USPC ............ 427/424, 542, 8; 118/300, 642, 708
See application file for complete search history.

(56) References Cited

U.S. PATENT DOCUMENTS

2012/0133084 A1* 5/2012 Ortner ..................... H01L 21/02
264/447

FOREIGN PATENT DOCUMENTS

JP        2011203311 A  * 10/2011

* cited by examiner

Primary Examiner — Alexander M Weddle
(74) Attorney, Agent, or Firm — Anova Law Group, PLLC

(57) ABSTRACT

A photoresist coating apparatus is provided. The photoresist coating apparatus includes a base; and a position platform moving back and forth along a scanning direction on the base. The photoresist coating apparatus also includes an imprinter having a trench configured to hold photoresist and fixed on the position platform; and a photoresist spray nozzle disposed above the imprinter and configured to spray the photoresist into the trench. Further, the photoresist coating apparatus includes a reticle frame configured to install a cylindrical reticle and enable the cylindrical reticle to rotate around a center axis and contact with the imprinter so as to coat the photoresist in the trench on a surface of the cylindrical reticle.

19 Claims, 6 Drawing Sheets

PHOTORESIST COATING APPARATUS AND METHODS

CROSS-REFERENCES TO RELATED APPLICATIONS

This application claims the priority of Chinese patent application No. 201310222164.4, filed on Jun. 5, 2013, the entirety of which is incorporated herein by reference.

FIELD OF THE INVENTION

The present invention generally relates to the field of semiconductor manufacturing technology and, more particularly, relates to photoresist coating apparatus and photoresist coating methods thereof.

BACKGROUND

A photolithography process, transferring patterns on a mask to a substrate by an exposure process, is an important process of the semiconductor manufacturing technology. The photolithography process is a core step in the manufacturing of large scale integrations (LSIs). The complex and time-consuming photolithography processes of the semiconductor manufacturing are mainly performed by corresponding exposure apparatus. Further, the development of the photolithography technology or the improvement of the exposure apparatus are mainly focused on three factors: feature size, overlay resolution, and yield.

In the manufacturing of a semiconductor device, the photolithography process may include three main steps: changing wafers on the wafer stages; aligning the wafers on the wafer stages; and transferring patterns on the mask to the wafers. These three steps may be sequentially repeated on the same wafer stage.

Various exposure apparatus with twin-stages have been developed in past a few years in order to further increase the yield of the exposure apparatuses. The exposure apparatus with twin-stages may refer that when one wafer stage is performing an exposure, the other wafer stage may perform wafer alignment simultaneously, thus the wafer waiting time may be reduced; and the exposure efficiency of the exposure apparatus may be improved.

Another more advanced exposure apparatus is a cylindrical reticle system. The cylindrical reticle system may include a base and a wafer stage group for holding wafers on the base. The wafer stage group may include a plurality of wafer stages moving between a first position and a second position in a circular manner. Further, the cylindrical reticle system may include an alignment detection unit configured above the first position of the base. The alignment detection unit may be utilized to detect stage fiducials on the wafer stage at the first position and the alignment marks on a wafer on the wafer stage at the first position to align the wafer.

Further, the cylindrical reticle system may also include a recticle stage on the second position of the base configured to hold a cylindrical reticle, and cause the cylindrical reticle to rate around a central axis of the reticle stage. The cylindrical reticle may be a hollow cylinder, and may have an imaging area and non-imaging areas at both sides of the imaging area. Further, the cylindrical reticle system may also include an illuminator box locating in the hollow cylindrical reticle to irradiate light through imaging area. Further, the cylindrical reticle system may also include an optical projection unit (lens) between the reticle stage and the base. The optical projection unit may be utilized to project the light passing through the imaging area of the cylindrical reticle onto an exposure region on the wafer on the wafer stage. When the wafer on the wafer stage moves from the first position to the second position and performs a unidirectional scan along a scan direction, the cylindrical reticle stage may rotate around the central axis for one cycle, the light passing through the imaging area of the cylindrical reticle may be projected onto the wafer on one wafer stage; and a column of exposure regions of the wafer along the scanning direction may be exposed.

The imaging area of the cylindrical reticle may include transparent regions and opaque regions; and the transparent regions and the opaque regions may form mask patterns. When an exposure light irradiates the imaging area of the cylindrical reticle, the light passing through the transparent regions may be projected onto the photoresist layer on the wafer, thus patterns corresponding to the mask patterns on the cylindrical reticle may be formed in the photoresist layer on the wafer.

The opaque regions of the imaging area of the cylindrical retile are usually formed by forming an opaque material layer on the imaging area; and followed by etching the opaque material layer. When the opaque material layer is etched, a photoresist layer may often be formed on the opaque material layer. However, how to form a uniform photoresist layer on the cylindrical reticle may be still a challenge. The disclosed device structures, methods and systems are directed to solve one or more problems set forth above and other problems.

BRIEF SUMMARY OF THE DISCLOSURE

One aspect of the present disclosure includes a photoresist coating apparatus. The photoresist coating apparatus includes a base; and a position platform moving back and forth along a scanning direction on the base. The photoresist coating apparatus also includes an imprinter having a trench configured to hold photoresist and fixed on the position platform; and a photoresist spray nozzle disposed above the imprinter and configured to spray the photoresist into the trench. Further, the photoresist coating apparatus includes a reticle frame configured to install a cylindrical reticle and enable the cylindrical reticle to rotate around a center axis and contact with the imprinter so as to coat the photoresist in the trench on a surface of the cylindrical reticle.

Another aspect of the present disclosure includes a method for using a photoresist coating apparatus. The method includes installing a cylindrical reticle on a reticle frame; and spraying photoresist to fill up a trench in an imprinter. The method also includes contacting the surface of the cylindrical reticle with a top surface of the imprinter. Further, the method includes moving a position platform having the imprinter along a scan direction; and rotating the cylindrical reticle around the center axis of the cylindrical reticle simultaneously.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-4 illustrate structures of a photoresist coating apparatus for a cylindrical reticle consistent with the disclosed embodiments.

Figure 1:
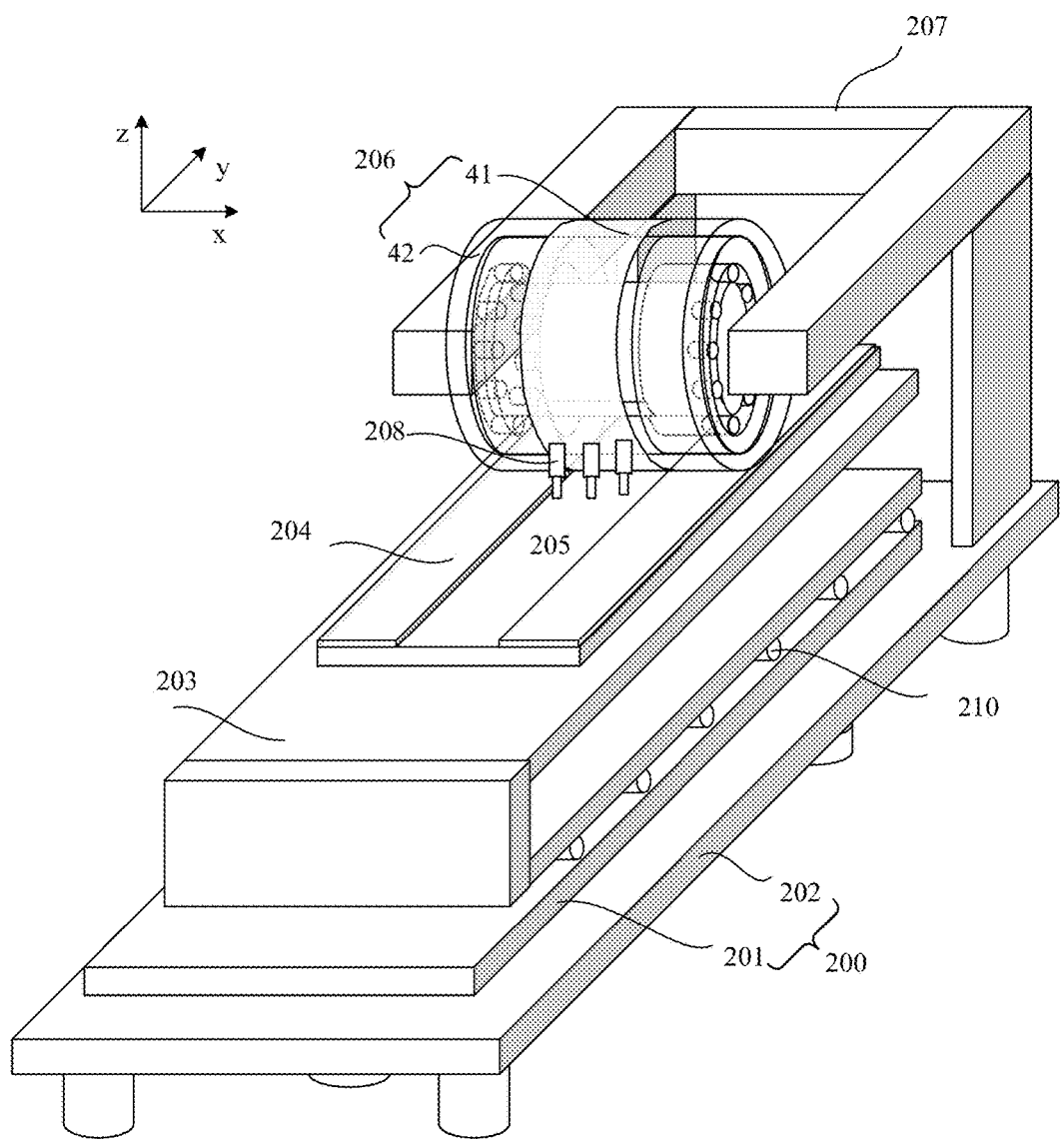
FIGS. 1~4 illustrate structures of a photoresist coating apparatus for a cylindrical reticle consistent with the disclosed embodiments.

As shown in FIG. 1, the photoresist coating apparatus may include a base 200 and a precisely controlled position platform 203 on the base 200. The precisely controlled position platform 203 may move back and forth along a scanning direction on the base 200.

Referring to FIG. 1, the base 200 may include an optical vibration isolated base platform 201 and a precisely controlled leveling platform 202. The precisely controlled leveling platform 201 may be on the optical vibration isolated base platform 202; and the precisely controlled position platform 203 may be on the precisely controlled leveling platform 201.

The optical vibration isolated base platform 202 may be used to eliminate external vibrations and disturbances; and may prevent the movement and the levelness of the precisely controlled leveling platform 201 and the precisely controlled position platform 203 from being affected by the external vibrations and disturbances. Thus, the coating precision of a photoresist coating process may be improved.

Further, as shown in FIG. 1, the photoresist coating apparatus may also include an imprinter 204. The imprinter may be fixed on the tope surface of the precisely controlled position platform 203. The imprinter 204 may have a trench 205 on the top surface of the imprinter 204. The trench 205 may be through a portion of the top surface of the imprinter 204. The trench 205 may be used to hold photoresist.

Further, as shown in FIG. 1, the photoresist coating apparatus may also include a photoresist spray nozzle 208. The photoresist spray nozzle 208 may be above the imprinter 204. The photoresist spray nozzle 208 may be used to spray photoresist into the trench 205. As used herein, the photoresist may refer to a liquid light-sensitive material. After being cured (baked), the photoresist may be become a thin solid film, and mask patterns may be obtained after subsequent exposure and developing processes, etc.

Further, as shown in FIG. 1, the photoresist coating apparatus may also include a reticle frame 207. The reticle frame 207 may be used to install a cylindrical reticle 206; and to drive the cylindrical reticle 206 to rotate around a central axis, i.e., the central axis of the cylindrical reticle 206. The reticle frame 207 may also be used to control the position and movement of the cylindrical reticle 206 such that the surface of the cylindrical reticle 206 may contact with the top surface of the imprinter 204.

When the trench 205 is filled up with photoresist by the photoresist spray nozzle 208, the surface of the cylindrical reticle 206 may contact with the top surface of the imprinter 204; and the precisely controlled position platform 203 may move along a scanning direction. At the same time, the cylindrical reticle 206 may rotate around the center axis; and the photoresist in the trench 205 may be coated on the surface of the cylindrical reticle 206.

The precisely controlled leveling platform 201 may be on the optical vibration isolated platform 202. The precisely controlled leveling platform 201 may have a leveling adjustment unit (not shown). The leveling adjustment unit may be manually and/or automatically adjusted to cause the precisely controlled leveling platform 201 to have a significantly high levelness. When the precisely controlled position platform 203 is installed on the precisely leveling platform 201, the surface of the precisely controlled position platform 203 may also have a relatively high levelness. Correspondingly, the surface of the imprinter 204 fixed on the top surface of the precisely controlled position platform 203 may also have a relatively high levelness. Thus, the surface of the photoresist held in the trench 205 of the imprinter 204 may have a relatively high levelness as well. When the photoresist in the trench 205 is coated on the surface of the cylindrical reticle 206, the thickness of the photoresist coated on the surface of the cylindrical reticle 206 may have an acceptable uniformity.

The precisely controlled leveling platform 201 and the precisely controlled position platform 203 may be coupled by a plurality of straight-line tracks 210. The direction of the tracks 210 may be parallel to the scanning direction. The number of the straight-line tracks 210 may be at least two. The straight-line tracks 210 may allow the precisely controlled position platform 203 to move back and forth linearly along only the straight-line direction limited by the tracks 210. Correspondingly, the imprinter 204 on the precisely controlled position platform 203 may only move along a single direction. That is, the imprinter 204 may only have a single position error. Thus, the position precision may be improved.

Each of the straight-line tracks 210 may have a fixed block (not shown) and a movable block (not shown) on the fixed block. A plurality of bearings may be in between the fixed block and the movable block. The fixed block may be fixed on the precisely controlled leveling platform 201; and the precisely controlled position platform 203 may be fixed on the movable block such that the precisely controlled position platform 203 can move along the track relative to the precisely controlled leveling platform 201.

The precisely controlled position platform 203 may connect with a third drive unit (not shown). Referring to FIG. 1, the third drive unit may be used to drive the precisely controlled position platform 203 to move back and forth on the precisely controlled leveling platform 201 along the scanning direction (the y-direction).

In certain other embodiments, the precisely controlled position platform 203 and the precisely controlled leveling platform 201 may be coupled by other appropriate means. Such coupling means may cause the precisely controlled platform to move along the x-axis, the y-axis, and/or the z-axis; and/or to rotate in the xy-plane.

Referring to FIG. 1, the cylindrical reticle 206 may be a hollow cylinder. The surface of the cylinder may include an image region 41 and two non-image regions 41 at both ends of the imaging region 41. Mask patterns may be subsequently formed on the image region 41. To form the mask patterns on the image region 41, a photoresist mask may need to be formed on the image region 41.

A plurality of photoresist spray nozzle 208 may be provided. The plurality of photoresist spray nozzles 208 may be aligned in one line. In certain other embodiments, a single photoresist spray nozzle 208 may be used. If only one photoresist spray nozzle 208 is used, the opening of the photoresist spray nozzle 208 may be rectangular. The width of the rectangular opening may be smaller than the width of the trench 205.

Figure 2:
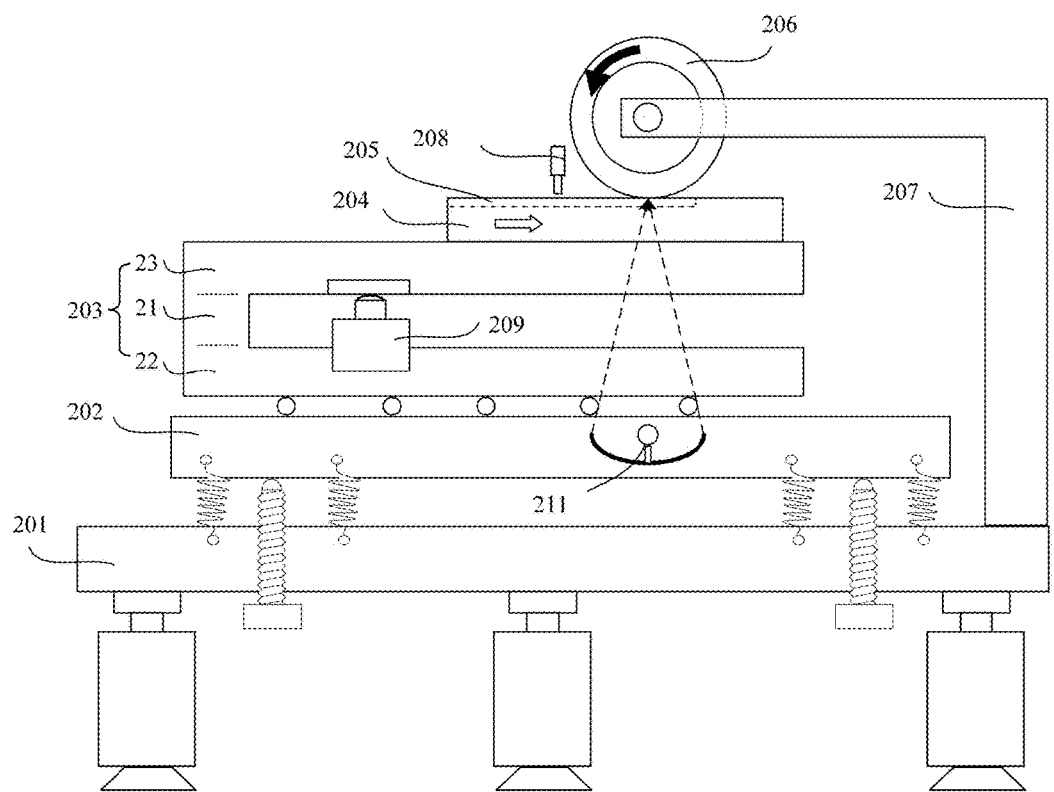

FIG. 2 is a side cross-section view of the photoresist coating apparatus illustrated in FIG. 1 along the x-axis. As shown in FIG. 2, the precisely controlled position platform 203 may be a sidelong "U" shape, including a first part 23 and a second part 22 parallel to the first part 23, and a third part 21 connecting with two ends of the first part 23 and the second part 22 between the first part 23 and the second part 22. The imprinter 204 is disposed on the surface of the first part 23 near to the opening side of the sidelong "U" shape of the precisely controlled position platform 203. The precisely controlled leveling platform 201 is coupled under the second part 22 of the precisely controlled position platform 203. In certain other embodiments, the precisely controlled position platform 203 may be other appropriate shape, and/or have different numbers of parts.

The precisely controlled position platform 203 may be made of any appropriate material. In one embodiment, the precisely controlled position platform 203 is made of quartz. Light of a radiation heating unit 211 may penetrate through the precisely controlled position platform 203 to heat the photoresist coated on the cylindrical reticle 206. The heat loss of the heating process may be reduced by using quartz.

The precisely controlled position platform 203 with sidelong "U" shape may be formed by etching an entire plate, or by a mechanical fabrication. The precisely controlled position platform 203 may also be formed by a casting process using a mold. The precisely controlled position platform 203 may also be constructed by two or three plates.

The contact conditions between the cylindrical reticle 206 and the imprinter 204 may significantly affect the thickness uniformity and the morphology of the photoresist coated on the cylindrical reticle 206. When the pressure between the cylindrical reticle 206 and the imprinter is significantly large, the movement of the imprinter 204 along the scan direction and the rotation of the cylindrical reticle 206 may be affected, it may be difficult to keep the cylindrical reticle 206 and the imprinter 204 to have an identical speed at the contact point between the cylindrical reticle 206 and the imprinter 204. Thus, it may be unable to uniformly coat the photoresist in the trench 205 onto the surface of the cylindrical reticle 206. Further, if the pressure is significantly large, the cylindrical reticle 206, the imprinter 204 and the first part 23 of the precisely controlled position platform 203 may be deformed. The deformation may deteriorate the photoresist coating. If the pressure between the cylindrical reticle 206 and the imprinter 204 is substantially small, the surface uniformity of the photoresist coated on the surface of the cylindrical reticle 206 may also be affected.

Therefore, the precisely controlled position platform 203 may need to be designed with an appropriate shape. In the disclosed embodiments, the precisely controlled position platform 203 is designed as the sidelong "U" shape. Referring to FIG. 2, the first part 23 and the second part 22 of the precisely controlled position platform 203 may be suspended; and a pressure detection unit 209 may be installed between the first part 23 and the second part 22 of the precisely controlled position platform 203. The pressure detection unit 209 may be used to detect the pressure on the first part 23. During a process for coating the photoresist onto the cylindrical reticle 206, when the surface of the cylindrical reticle 206 contacts with the imprinter 204 fixed on the top surface of the first part 23, the pressure generated in the process for coating the photoresist may be detected. According to the value of the pressure, the contact conditions between the cylindrical reticle 206 and the imprinter 204 may be monitored. When the pressure is significantly large or substantially small, the height of the cylindrical reticle 206 may be adjusted to have an appropriate pressure value (pre-determined threshold value); and/or an alarm message may be sent out.

Further, referring to FIG. 2, the pressure detection unit 209 may locate between the first part 23 and the second part 22 of the precisely controlled position platform 203; and may be away from the opening of the sidelong "U" shape (near to the third part 21 of the precisely controlled platform 203). That is, the pressure detection unit 209 may be below the left side of the imprinter 204. Such a configuration may enable the pressure detection unit 209 to effectively detect the pressure generated on the first part 23 of the precisely controlled platform 203 during the entire process for coating the photoresist.

The pressure detection unit 209 may include a pressure sensor (not shown) and a height actuator (not shown). The pressure sensor may be on the bottom surface of the first part 23; and the height actuator may be on the top surface of the second part 22. The sharp portion of the height actuator may contact with the pressure sensor. When a pressure is applied on the first part 23, the height actuator press the surface of the pressure sensor, and the pressure may be converted into electric signals by the pressure sensor. When the cylindrical reticle does not contact with the imprinter, the output of the pressure sensor may be zero or a substantially small value. The height actuator may adjust the distance between the first part 23 and the second part 22 according to the pressure value from the pressure sensor to obtain an appropriate pressure.

In one embodiment, the photoresist coating apparatus may have a position detection unit (not shown). The position detection unit may be used to detect the position of the precisely controlled position detection platform 203. Because the position of the imprinter 204 and the position of the precisely controlled position platform 203 may be relatively fixed, the position of the imprinter 204 may be precisely determined after obtaining the position of the precisely controlled position platform 203. For example, the position detection unit may be an optical interferometer.

Figure 3:
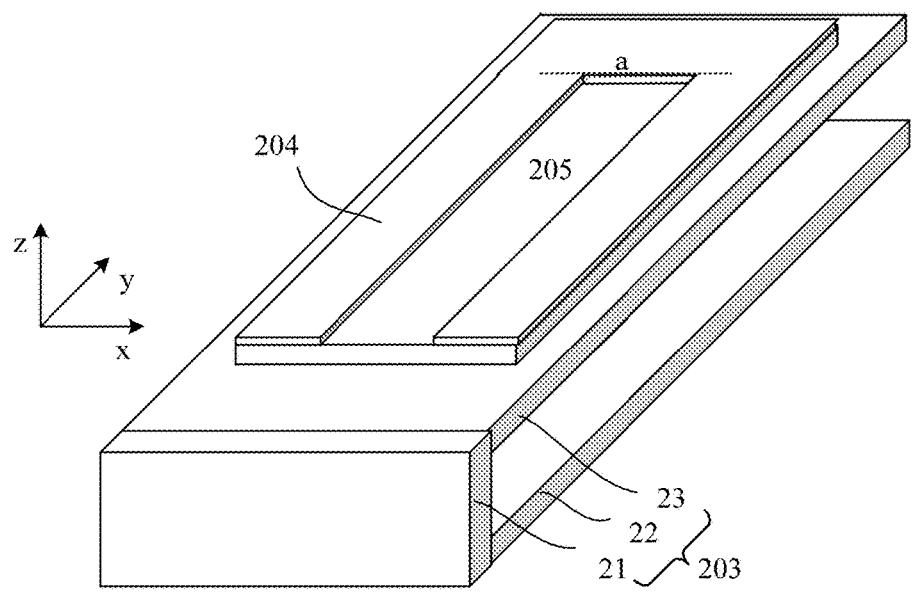

Further, as shown in FIG. 3, the imprinter 204 may be fixed on the surface of the first part 23 of the precisely controlled platform 203. Various methods may be used to fix the imprinter 204. In one embodiment, the imprinter 204 is fixed by a vacuum suction method or an electromagnetic suction method.

Referring to FIG. 3, a trench 205 may be formed on the imprinter 204; and the trench 205 may be through one side surface of the imprinter 204 which is perpendicular to the scan direction (that is, the side surface is parallel to the x-axis); and may extend to the other side surface of the imprinter 204. As shown in FIG. 3, the trench 205 may end at the line "a". Because the trench 205 may be through at one side surface of the imprinter 204, when the photoresist is being coated onto the cylindrical reticle 206, excess photoresist may overflow through that side surface of the imprinter 204, thus thickness of the photoresist in the trench 205 may be identical to the depth of the trench 205. The other side surface of the trench 205 may be at the line "a", when the surface of the cylindrical reticle 206 contacts with the imprinter 204, the contact line of the cylindrical reticle 206 and the imprinter 204 may concide, thus the line "a' may be used as a start point of the coating of the photoresist; and it may aid to control the stop point of the coating of the photoresist.

In certain other embodiments, the trench 205 may be through both side surfaces of the imprinter 204 which are perpendicular to the scan direction; That is, both ends of the trench 205 are open; and excess photoresist may overflow through both side surfaces of the imprinter 204 which are perpendicular to the scan direction.

In certain other embodiments, the trench 205 may be entirely internal to the imprinter 204. That is, two ends of the trench 205 are close, and excess photoresist may overflow from other structures, such as grooves, etc.

The trench 205 may be used to hold photoresist. The depth of the trench 205 (the size along the z-axis) may determine the thickness of the photoresist formed on the cylindrical reticle 206. In one embodiment, the depth of the trench 205 may be in a range of approximately 20 nm~5000 nm. The width of the trench 205 (the size along the x-axis) may determine the width of the photoresist formed on the cylindrical reticle 206. In one embodiment, the width of the trench 205 may be equal to the width of the image region 41 of the cylindrical reticle 206. When the surface of the cylindrical reticle 206 contacts with the imprinter 204, the position of the image region 41 of the cylindrical reticle 206 may correspond to the position of the trench 205 of the imprinter 204. That is, the image region 41 of the cylindrical reticle 206 may be right above the trench 205 of the imprinter 204.

The length of the trench 205 of the imprinter 204 may be greater than or equal to the surface perimeter of the cylindrical reticle 206. When the trench 205 is filled up with photoresist by the photoresist spray nozzle 208; the surface of the cylindrical reticle 206 may contact with the top surface of the imprinter 204; and the precisely controlled position platform 203 may move along the scan direction. At the same time, the cylindrical reticle 206 may rotate around the center axis. When the cylindrical reticle 206 rotates for one cycle; and the precisely controlled position platform 203 moves a distance equal to the length of the trench 205, the entire surface of the image region 41 may be coated with the photoresist in the trench 205.

The top surface of the imprinter 205 and the side surfaces and the bottom surface of the trench 205 may be hydrophilic (oleophobic) surfaces. When the trench 205 is filled up the photoresist by the photoresist spray nozzle 208, the adhesion force between the photoresist and the side surfaces and the bottom surface of the trench 205 may be substantially small, it may aid to coat the photoresist on the surface of the cylindrical reticle 206; and prevent photoresist residue in the trench 205. Correspondingly, the surface of the cylindrical reticle 206 may be a hydrophobic (oleophilic) surface, thus the adhesive force between the photoresist and the cylindrical reticle 206 may be significantly strong. When the surface of the cylindrical reticle 206 contacts with the imprinter 204, it may be easy to adhere the photoresist in the trench 205 onto the surface of the cylindrical reticle 206; and it may improve the thickness uniformity of the phoresist formed on the surface of the cylindrical reticle 206. The surface roughness of the surface of the imprinter 204 and the side surface of the trench 205 may be smaller than approximately 10 nm. Such a roughness may cause the imprinter 204 to have a minimum adhesion force onto the photoresist.

Various processes may be used to obtain the hydrophobic surface or the hydrophilic surface, such as a plasma treatment process, or a chemical treatment process, etc. In one embodiment, the cylindrical recticle 206 may be treated by exposing a hexamethyldisilazane (HDMS) vapor at an elevated temperature to obtain a hydrophobic (oleophilic) surface.

The imprinter 204 may be made of any appropriate material. In one embodiment, the imprinter 204 is made of quartz. The surface of the imprinter 204 and the side surface and the bottom surface of the imprinter 204 may be formed to be smooth by any appropriate microfabrication process. The smooth surface may provide bases for obtaining hydrophilic (oleophobic) surfaces or hydrophobic (oleophilic) surfaces. Further, quartz may transfer heat; and may be transparent. A radiation heating unit may heat the photoresist formed on the cylindrical reticle 206 through the imprinter 204 made of quartz; and the photoresist formed on the surface of the cylindrical reticle 206 may be cured in situ. In certain other embodiments, more than one layers of hydrophilic (oleophobic) material may be formed on the surface of the imprinter 204 and the side surfaces and the bottom surface of the trench 205.

The trench 205 on the imprinter 204 may be formed by any appropriate process. In one embodiment, the trench 205 may be formed by one piece of quartz substrate. In certain other embodiments, the trench 205 may be formed by bonding a substrate with a top plate having an opening.

Further, portions of the imprinter 204 at both sides of the trench 204 may have a plurality of grooves (not shown). One end of the grooves may be through the end surface of the imprinter 204 parallel to the scan direction (the y-axis); and the other end of the grooves may connect with the trench 205. The grooves may aid excess photoresist to overflow out the trench 205, thus the thickness uniformity of the photoresist formed on the cylindrical reticle 206 may be improved.

Figure 4:
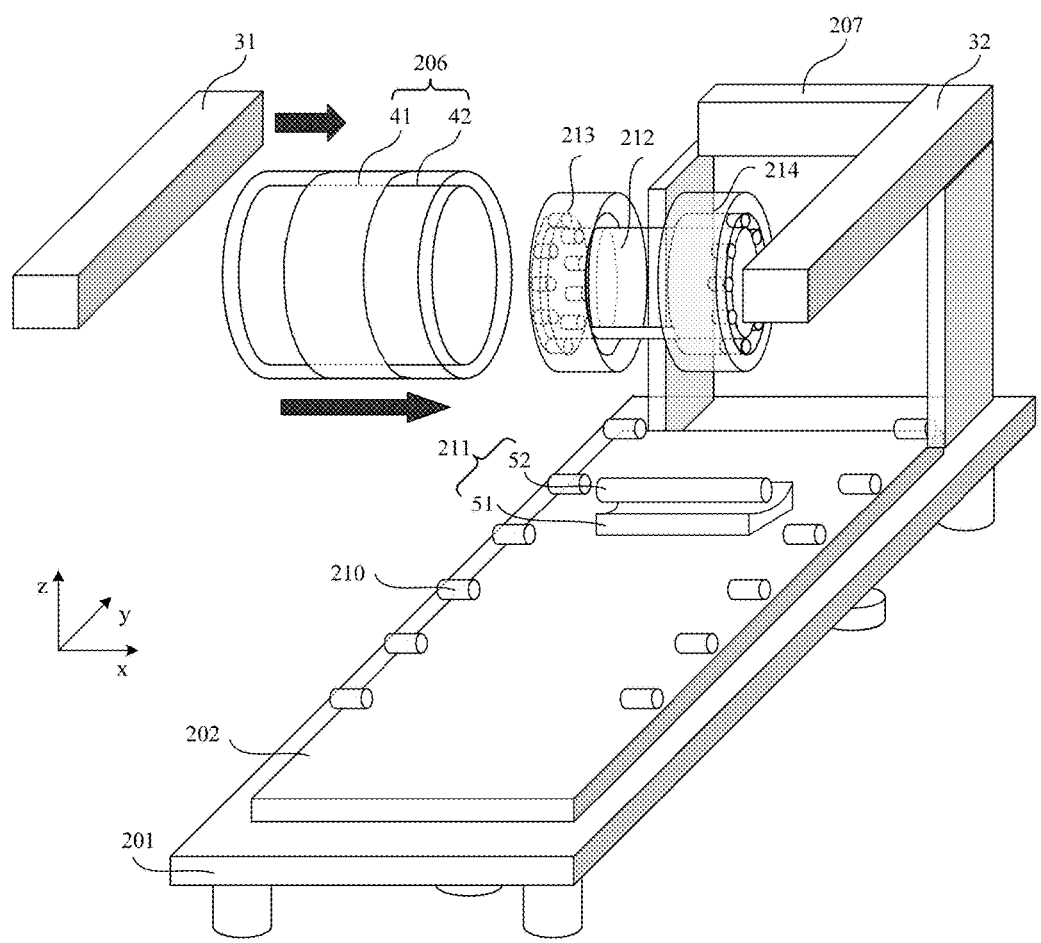

Further, as shown in FIG. 4, the precisely controlled leveling platform 202 may have a radiation heating unit 211; and the radiation heating unit 211 may be directly under the contact region of the cylindrical reticle 206 and the imprinter 204. The radiation heating unit 211 may be used to heat the photoresist formed on the cylindrical reticle 206. The radiation heating unit 211 may be under the cylindrical reticle 206; and the relative position between the radiation heating unit 211 and the cylindrical reticle 206 may be fixed, thus when the photoresist in the trench 205 of the imprinter 204 is coated on the surface of the cylindrical reticle 206, the radiation heating unit 211 may in situ heat the freshly coated photoresist on the cylindrical reticle 206. When the freshly coated photoresist is heated, a portion of the solvent in the photoresist may be evaporated; and the photoresist coated on the surface of the cylindrical reticle 206 may be cured. Thus, it may prevent the photoresist coated on surface of the cylindrical reticle 206 from peeling off from the cylindrical reticle 206 under the gravity and the centrifuge force. The heating process may be referred as a soft-bake process.

Referring to FIG. 4, the radiation heating unit 211 may include a radiation light source 52 and a reflector 51; and the reflector 51 may be under the radiation light source 52. The reflector 51 may focus the light radiating from the radiation heating unit 211 onto the surface of the photoresist coated on the surface of the cylindrical reticle 206. The reflector 52 may be a square or a cylinder having a convex surface. The convex surface may be a reflecting surface. The reflected light may be focused on in the photoresist coated on the surface of the cylindrical reticle 206. The radiation light source 52 may be an infrared radiation light source with a line shape. The line shape radiation light source 52 may be parallel to the central axis of the cylindrical reticle 206. Further, the length of the line shape radiation light source 52 may be greater than the width of the image region 41 of the cylindrical reticle 206.

The line shape radiation light source 52 may be able to radiate uniform heat along a line. The heat may be reflected by the convex surface of the reflector 51 and focused on the photoresist coated on the surface of the cylindrical reticle 206. The focused radiation power may linearly distribute in the photoresist coated on the surface of the cylindrical reticle 206. Thus, the photoresist coated on image region 41 of the cylindrical reticle 206 may be uniformly heated.

Further, as shown in FIG. 4, the reticle frame 207 may include a first suspending arm 31 and a second suspending arm 32. A shaft 212 may be fixed at one end of the second suspending arm 32. Further, a first bearing 214 and a second bearing 213 may be installed on the shaft 212. The first bearing 214 may be installed at one end of the shaft 212 near to the second suspending arm 32; and the second bearing 213 may be installed on the other end of the shaft 212 away from the second suspending arm 32.

The first bearing 214 and the second bearing 213 may all include a bearing outer ring (not shown), a bearing inner ring (not shown) and rolling elements (not shown) between the bearing inter ring and the bearing outer ring. The bearing inner ring of both the first bearing 213 and the second bearing 214 may be fixed on the shaft 212. The cylindrical reticle 206 may be installed on the bearing outer ring of the first bearing 214 and the bearing outer ring of the second bearing 213. The cylindrical reticle 206 may be a hollow cylinder. The cylindrical reticle 206 may have an image region 41 and two non-image regions 42 at both ends of the image region 41. The cylindrical reticle 206 may be installed on the bearing outer rings of the first bearing 214 and the second bearing 213. The inner surface of the non-imaging regions 42 of the cylindrical reticle 206 may contact with the bearing outer ring of the first bearing 214 and the bearing outer ring of the second bearing 213. After installing the cylindrical reticle 206 in the recticle frame 207, when the first bearing 214 and the second bearing 214 rotate around the shaft 212 (or the central axis of the cylindrical reticle 206), the cylindrical reticle 206 may also rotate around shaft 212.

In one embodiment, the first suspending arm 31 may be a movable arm, before installing the cylindrical reticle 206; the first suspending arm 31 may be detached from the shaft 212. After the cylindrical reticle 206 is installed on the first bearing 214 and the second bearing 213, the first suspending arm 31 may move back to the shaft 212, and the first suspending arm 31 may be fixed on the end of the shaft 212 again.

In certain other embodiments, the first bearing 214 and the second bearing 213 may be electromagnetic bearings. The electromagnetic bearings may include a bearing outer ring, a bearing inner ring and coils between the bearing outer ring and the bearing inner ring. The rotation of the bearing outer ring may be precisely controlled by adjusting current distributions of the coils.

The edge of the non-image region 42 of the cylindrical reticle 206 may have a trench or a hole through the thickness of the cylindrical reticle 206, the initial position of the rotation of the cylindrical reticle 206 may be defined by detecting the position of the trench or the hole.

In one embodiment, the shaft 212 may be a hollow shaft; and a through groove (not shown) may be formed in the shaft 212. The radiation heating unit 211 may be installed inside the hollow shaft 212; and the inner surface of the hollow shaft 212 may be a reflecting surface. The heat (or light) irradiating from the radiation heating unit 211 may pass through the trench; and shine on the image region 41 of the cylindrical reticle 206. Thus, the photoresist coated on the surface of the cylindrical reticle 206 may be heated and cured (soft-bake). Because the distance between the radiation heating unit 211 and the cylindrical reticle 206 may be relatively small, the heat loss of the heating process may be substantially small, the heating efficiency may be improved.

Further, the recticle frame 207 may also include a first drive unit (not shown). The first drive unit may be used to drive the cylindrical reticle 206 to rotate around the center axis.

Further, the reticle frame 207 may also include a second drive unit (not shown). The second drive unit may be used to adjust the height of the cylindrical reticle 206 to contact with the surface of the imprinter 204, or leave the surface of the imprinter 204. Referring to FIG. 2, the second drive unit may communicate with the pressure detection unit 209. When the pressure detected by the pressure detection unit 209 is greater or smaller than the pre-determined threshold value, the pressure detection unit 209 may send a signal to the second drive unit; and the second drive unit may adjust the height of the cylindrical reticle 206.

Further, the reticle frame 207 may also include a fourth drive unit (not shown). The fourth drive unit may be used to adjust the position of the cylindrical reticle on the xy-plane.

Figure 7:
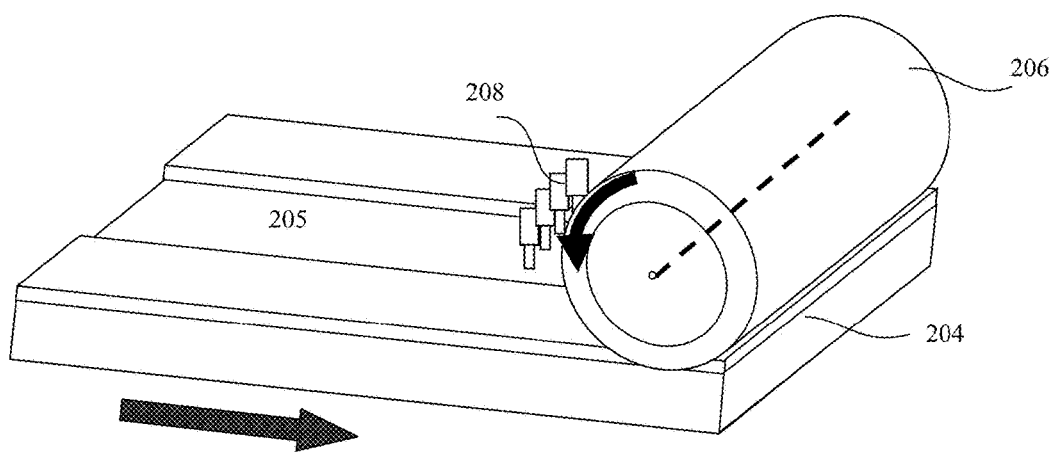
Figure 8:
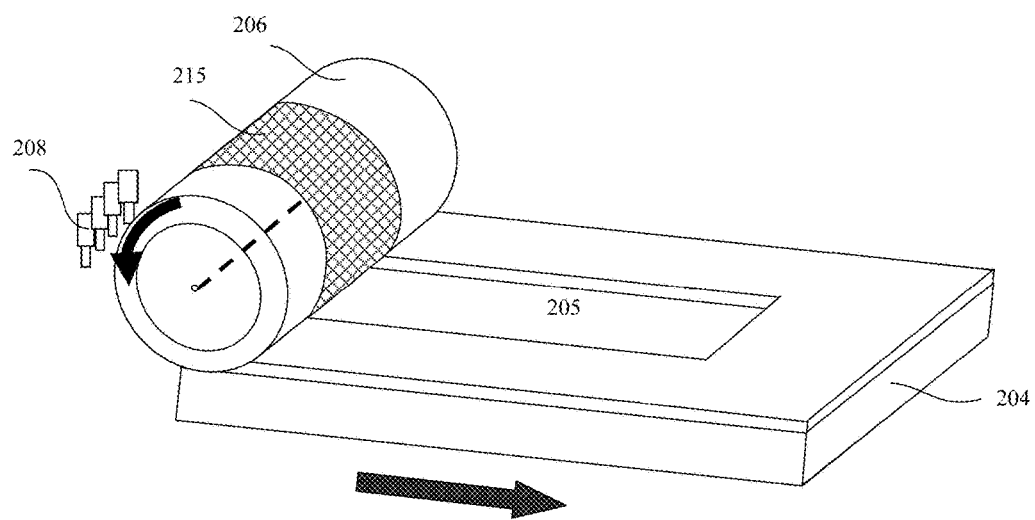
Figure 9:
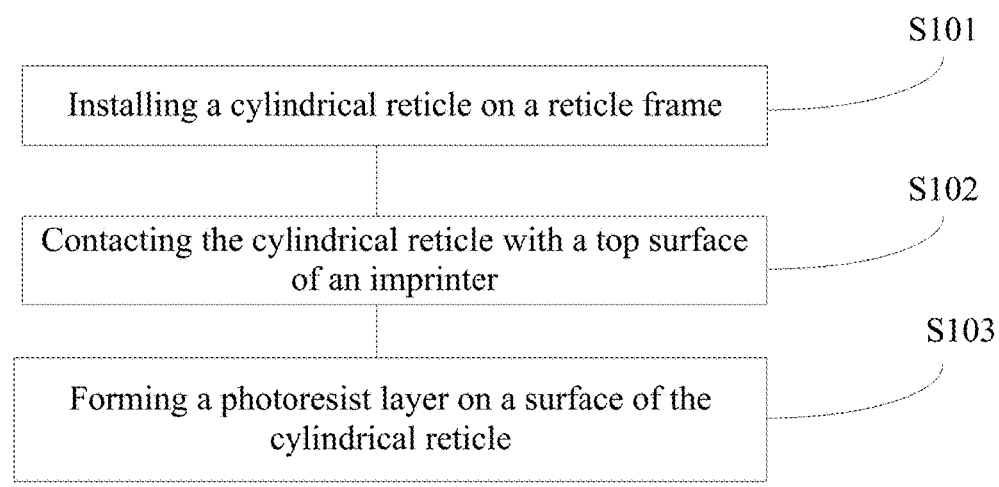
FIG. 9 illustrates an exemplary photoresist coating process consistent with the disclosed embodiments.

FIG. 9 illustrates an exemplary photoresist coating process consistent with the disclosed embodiments; and FIGS. 5~8 illustrate apparatus structures corresponding to certain stages of the exemplary photoresist coating process consistent with the disclosed embodiments.

Figure 5:
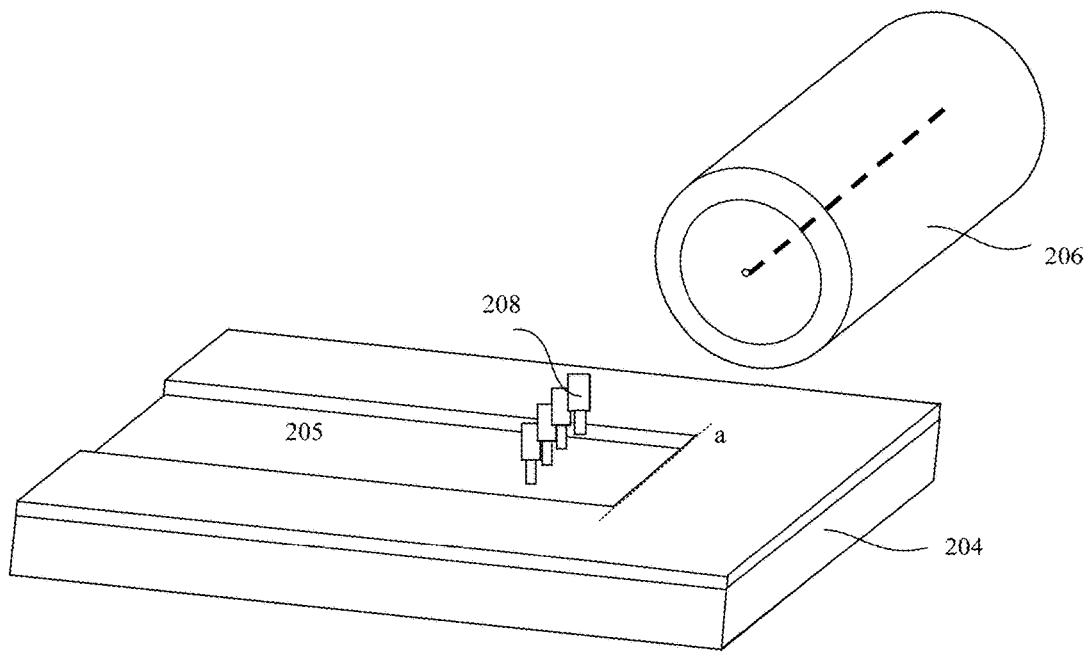
FIGS. 5~8 illustrate apparatus structures corresponding to an exemplary photoresist coating process consistent with the disclosed embodiments.

As shown in FIG. 9, at the beginning of the photoresist coating process, a cylindrical reticle having certain structures is provided, and is installed in a reticle frame (S101). FIG. 5 illustrates a corresponding apparatus structure.

As shown in FIG. 5, a cylindrical reticle 206 is provided and installed in a reticle frame. A to-be-etched layer (not shown) may be formed on the surface of the cylindrical reticle 206. A photoresist layer may be subsequently formed on the surface of the cylindrical reticle 206 and may be used as an etching mask to form mask patterns on the image region 41 of the cylindrical recticle 206.

The to-be-etched layer may be made of any appropriate material including opaque material, or semitransparent material, etc. In one embodiment, the to-be-etched layer is made of Cr.

Before installing the cylindrical reticle 206, the cylindrical reticle with the to-be-etched layer may be heat treated in a HDMS environment. The heat treatment may cause the to-be-etched layer to have a hydrophobic (or oleophilic) surface, so that it may be easy for the photoresist to adhere the surface of the cylindrical reticle 206.

Referring to FIG. 5, after installing the cylindrical reticle 206, the imaging region 41 of the cylindrical reticle 206 may be above the left side of the trench 205. When the cylindrical reticle 206 is being installed; or after the cylindrical reticle 206 is installed, the photoresist spray nozzle 208 may spray photoresist into the trench 205 of the imprinter 204; and fill up the trench 205.

Before the photoresist spray nozzle 208 starts to spray photoresist into the trench 205, the precisely controlled position platform 203 (referring to FIG. 2) may be initialized. The initialization process may cause the imprinter 204 fixed on the precisely controlled position platform 203 to be at the initial position.

Figure 6:
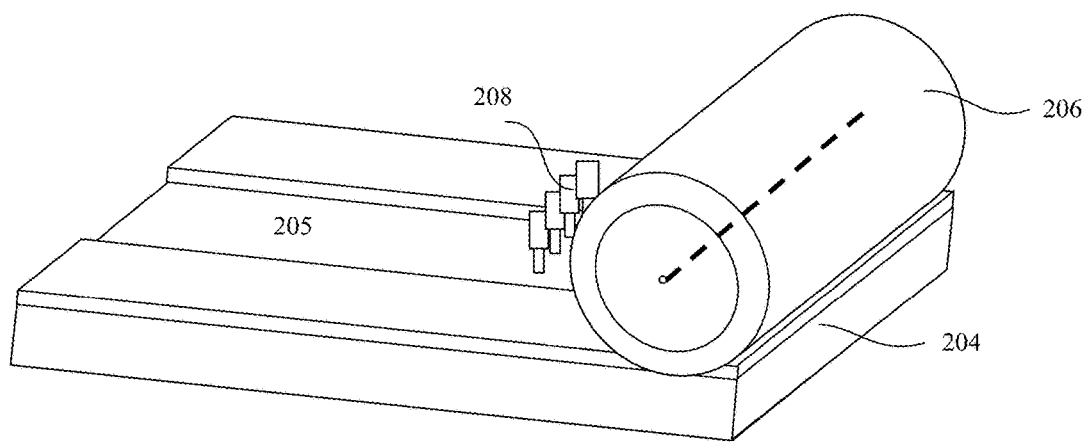

Returning to FIG. 9, after installing the cylindrical reticle 206, the surface of the cylindrical reticle 206 may contact with top surface of the imprinter 204 (S102). FIG. 6 illustrates a corresponding apparatus structure.

As shown in FIG. 6, the surface of the cylindrical recticle 206 contacts with the top surface of the imprinter 204. When the surface the cylindrical reticle 206 contacts with the top surface of the imprinter 204, the contact line between the surface the cylindrical reticle 206 and the top surface of the imprinter 204, one end surface of the trench 205 and the boundary line "a" (referring to FIG. 5) on the surface of the imprinter 204 may coincide.

Further, referring to FIGS. 5~6, the contact line between the surface the cylindrical reticle 206 and the top surface of the imprinter 204 may be through the trench or the through hole (not shown) of the non-image region 42 of the cylindrical reticle 206. That is, the start position of the photoresist coating process may be the surface of the cylindrical reticle 206 corresponding to the extension direction of the trench or the through hole (a direction parallel to the cylindrical reticle 206). The end point of the process of the photoresist coating process may be the position after the cylindrical reticle 206 rotates one cycle. Because there may a photoresist overlapping at the start point and the end point of the photoresist coating process, the imaging region 41 of the cylindrical reticle 206 along the extension direction of the trench and the through hole may be used as a vacant area of the mask patterns, and the mask patterns may be not be subsequently formed in the overlap region.

In certain other embodiments, when the surface of the cylindrical reticle 206 contacts with the top surface of the imprinter 204, the contact line between the cylindrical reticle 206 and the imprinter 204 may be away from the boundary line "a" between the end surface of the trench 205 and the imprinter 204. The boundary line "a" may be parallel to the contact line between the cylindrical reticle 206 and the imprinter 204. Thus, before the cylindrical reticle 206 contacts with the trench 205, the cylindrical reticle 206 and the trench 205 may be accelerated. When the cylindrical reticle 206 and the imprinter 204 contact with each other and after the cylindrical reticle 206 contacts with the imprinter 204, the cylindrical reticle 206 and the imprinter 204 may move with a constant speed, thus the photoresist may be uniformly coated on the surface of the cylindrical reticle 206.

Returning to FIG. 9, after the cylindrical reticle 206 contacts with the imprinter 204, a photoresist layer may be formed on the surface of the cylindrical reticle 206 (S103). FIGS. 7~8 illustrate corresponding apparatus structures.

As shown in FIGS. 7~8, after the surface of the cylindrical reticle 206 contacts with the top surface of the imprinter 204, the precisely controlled position platform 203 may move along the scan direction to cause the imprinter 204 to move along the scan direction as well. At the same time, the cylindrical reticle 206 may rotate around the center axis. Thus, the photoresist in the trench 205 may be coated on the surface of the cylindrical reticle 206; and a photoresist layer 215 is formed on the surface of the cylindrical reticle 206.

The moving speed of the precisely controlled position platform 203 along the scanning direction may be equal to the line speed of the surface of the cylindrical reticle 206 during rotating around the center axis. Further, the moving speed and the line speed may be both a constant speed. The constant speed may prevent a compressing or a tearing to the photoresist in the trench 205 caused by a difference between the line speed of the surface of the cylindrical reticle 206 and the moving speed of the precisely controlled position platform 206. Thus, a uniform photoresist layer 215 may be obtained.

During the photoresist coating process, the pressure detection unit 209 (referring to FIG. 2) may detect the pressure applied downwardly onto the precisely controlled position platform 203. When the detected pressure is greater or smaller than the pre-determined value, a fine adjustment to the height of the cylindrical reticle 206 may be performed; and/or an error massage may be sent.

During the photoresist coating process, the radiation heating unit 211 (referring to FIG. 2) may heat the photoresist layer 215 formed on the surface of the cylindrical reticle 206. The heating process may be referred as a soft-bake process. Because the precisely controlled platform 203 and the imprinter 204 may be made of quartz, the photoresist layer 215 may be in situ heated during the photoresist coating process.

After forming the photoresist layer 215, an exposing and developing process may be performed to form a patterned photoresist on the cylindrical reticle 206.

Further, after forming the patterned photoresist, the residual photoresist, including edge beads, etc, on the non-image regions 42 of the cylindrical reticle 206 may be removed. The residual photoresist may be removed by any appropriate process. In one embodiment, the residual photoresist may be removed by exposing the residual photoresist with an ultraviolet light; and followed by a developing process.

Further, after forming the patterned photoresist, mask patterns may be formed by etching the to-be-etched layer using the patterned photoresist as a mask. The to-be-etched layer may be etched by any appropriate process, such as a dry etching process, or a wet etching process, etc. The cylindrical reticle with the mask patterns may be subsequently used for obtaining patterns on substrates by a photolithography process.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A photoresist coating apparatus, comprising:
   a base;
   a position platform moving back and forth along a scanning direction on the base;
   an imprinter fixed on the position platform, the imprinter having a trench configured to hold photoresist;
   a photoresist spray nozzle disposed above the imprinter and configured to spray the photoresist into the trench; and
   a reticle frame configured to install a cylindrical reticle and enable the cylindrical reticle to rotate around a center axis and contact the imprinter so as to coat the photoresist in the trench on a surface of the cylindrical reticle.

2. The photoresist coating apparatus according to claim 1, wherein:
   the reticle stage includes a first drive unit configured to drive the cylindrical reticle to rotate around the center axis; and a second drive unit configured to adjust a height of the cylindrical reticle.

3. The photoresist coating apparatus according to claim 2, wherein:
   the cylindrical reticle is a hollow cylinder configured to rotate with a constant speed around the center axis of the cylinder;
   the cylindrical reticle is installed in a shaft of the reticle frame by electromagnetic bearings; and
   the reticle stage is mounted on a base platform that is isolated from vibrations.

4. The photoresist coating apparatus according to claim 1, wherein:
a top surface of the imprinter and side and bottom surfaces of the trench are hydrophilic or oleophobic surfaces; and
a surface of the cylindrical reticle is a hydrophobic or oleophobic surface.

5. The photoresist coating apparatus according to claim 1, wherein:
the imprinter is made of quartz.

6. The photoresist coating apparatus according to claim 1, wherein:
a depth of the trench is in a range of approximately 20 nm~5000 nm.

7. The photoresist coating apparatus according to claim 1, wherein:
the base includes an optical vibration isolated platform and a leveling platform;
the leveling platform is on the optical vibration isolated platform; and
the position platform is on the leveling platform.

8. The photoresist coating apparatus according to claim 7, wherein:
the leveling platform and the position platform are coupled by straight-line tracks; and
a direction of a distribution of the straight-line tracks is parallel to a direction of the scan direction.

9. The photoresist coating apparatus according to claim 7, wherein:
a shape of the position platform is a sidelong "U" shape;
the position platform includes a first part, a second part parallel to the first part; and a third part between the first part and the second part connecting with ends of the first part and the second part;
the imprinter is on a top surface of the first part; and
the leveling platform is under the second part.

10. The photoresist coating apparatus according to claim 9, wherein:
a pressure detection unit configured to detect a pressure on the first part is disposed between the first part and the second part.

11. The photoresist coating apparatus according to claim 10, wherein:
the pressure detection unit includes a pressure sensor and an actuator;
the pressure sensor is configured to measure a pressure on the first part; and
the actuator is configured to adjust the pressure to keep a pre-determined constant pressure.

12. The photoresist coating apparatus according to claim 7, wherein:
a radiation heating unit is disposed on the leveling platform;
the radiation heating unit is under a contact line between the cylindrical reticle and the imprinter; and
the radiation heating unit is used to in situ soft-bake a photoresist layer formed on the cylindrical reticle.

13. The photoresist coating apparatus according to claim 12, wherein:
a source of the radiation heating unit is an infrared light source.

14. The photoresist coating apparatus according to claim 7, further including:
a position detection unit configured to detect positions of the position platform.

15. A method for using a photoresist coating apparatus, comprising:
installing a cylindrical reticle on a reticle frame;
spraying photoresist into a trench in an imprinter to fill up the trench;
contacting the surface of the cylindrical reticle with a top surface of the imprinter;
moving a position platform having the imprinter along a scan direction; and
rotating the cylindrical reticle around the center axis of the cylindrical reticle simultaneously.

16. The method according to claim 15, wherein:
a moving speed of the position platform is equal to a line speed of a surface of the cylindrical reticle rotating around the center axis.

17. The method according to claim 15, moving the position platform and rotating the cylindrical reticle simultaneously, further including:
measuring a downward pressure on the position platform; and
adjusting the pressure to match a pre-determined value.

18. The method according to claim 15, moving the position platform and rotating the cylindrical reticle simultaneously, further including:
heating a photoresist layer formed on the cylindrical reticle by an in situ radiation heating process.

19. The method according to claim 15, before installing the cylindrical reticle, further including:
treating the cylindrical reticle to obtain a hydrophobic or oleophobic surface.

* * * * *